(12) United States Patent
Kitajima et al.

(10) Patent No.: US 12,198,978 B2
(45) Date of Patent: Jan. 14, 2025

(54) METHOD OF MANUFACTURING SEMICONDUCTOR DEVICE

(71) Applicant: SUMITOMO ELECTRIC DEVICE INNOVATIONS, INC., Kanagawa (JP)

(72) Inventors: Shouhei Kitajima, Kanagawa (JP); Ryo Kasai, Kanagawa (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 403 days.

(21) Appl. No.: 17/820,049

(22) Filed: Aug. 16, 2022

(65) Prior Publication Data

US 2023/0103850 A1    Apr. 6, 2023

(30) Foreign Application Priority Data

Oct. 1, 2021    (JP) .................. 2021-162544

(51) Int. Cl.
  *H01L 21/768*    (2006.01)
  *H01L 21/04*     (2006.01)
  *H01L 21/308*    (2006.01)

(52) U.S. Cl.
  CPC .... *H01L 21/76831* (2013.01); *H01L 21/0495* (2013.01); *H01L 21/3081* (2013.01); *H01L 21/76805* (2013.01); *H01L 21/76871* (2013.01)

(58) Field of Classification Search
  CPC ........... H01L 21/76831; H01L 21/0495; H01L 21/3081; H01L 21/308; H01L 21/306; H01L 21/76805; H01L 21/76871; H01L 21/76898; H01L 23/3677; H01L 23/481; H01L 29/7786; H01L 29/2003; H01L 21/32134; H01L 29/66462; H01L 21/3065
  See application file for complete search history.

(56) References Cited

U.S. PATENT DOCUMENTS

| 6,607,650 B1 | 8/2003 | Niuya et al. |
| 2016/0351521 A1* | 12/2016 | Kume ............... H01L 21/76898 |
| 2019/0259662 A1 | 8/2019 | Kosaka et al. |
| 2020/0035551 A1 | 1/2020 | Kosaka et al. |

FOREIGN PATENT DOCUMENTS

| JP | 2019-145546 | 8/2019 |
| JP | 2020-017647 | 1/2020 |
| WO | 2001/007687 | 2/2001 |

* cited by examiner

*Primary Examiner* — Thanhha S Pham
(74) *Attorney, Agent, or Firm* — IPUSA, PLLC

(57) ABSTRACT

A method of manufacturing a semiconductor device includes forming a semiconductor layer on an upper surface of a substrate, forming an etching stopper on an upper surface of the semiconductor layer, forming a metal mask including a seed film and a plating film on a lower surface of the substrate, the metal mas having an opening inside the etching stopper in plan view, forming a through-hole in the substrate and the semiconductor layer from the lower surface of the substrate to the etching stopper through the opening, and removing the plating film by an anodic reaction in an electrolyte solution after forming the through-hole.

9 Claims, 17 Drawing Sheets

METHOD OF MANUFACTURING SEMICONDUCTOR DEVICE

CROSS REFERENCE TO RELATED APPLICATIONS

This application is based on and claims priority to Japanese Patent Application No. 2021-162544 filed on Oct. 1, 2021, the entire contents of which are incorporated herein by reference.

TECHNICAL FIELD

The present disclosure relates to a method of manufacturing a semiconductor device.

BACKGROUND

A semiconductor device is known in which a semiconductor layer is formed on a substrate, an etching stopper made of metal is formed on the semiconductor layer, a through-hole reaching the etching stopper is formed in the substrate and the semiconductor layer, and a bottom electrode connected to the etching stopper through the through-hole is formed on a lower surface of the substrate. When such a semiconductor device is manufactured, a metal mask is formed on the lower surface of the substrate and the substrate is etched to form the through-hole.

[Patent Document 1] International Patent Publication No. WO 01/07687
[Patent Document 2] Japanese Unexamined Patent Application Publication No. 2019-145546
[Patent Document 3] Japanese Unexamined Patent Application Publication No. 2020-17647

SUMMARY

A method of manufacturing a semiconductor device according to the present disclosure includes forming a semiconductor layer on an upper surface of a substrate, forming an etching stopper on an upper surface of the semiconductor layer, forming, on a lower surface of the substrate, a metal mask including a seed film and a plating film and having an opening inside the etching stopper in plan view, forming, through the opening, a through-hole extending from the lower surface of the substrate to the etching stopper in the substrate and the semiconductor layer, and after the forming the through-hole, removing the plating film by an anodic reaction in an electrolyte solution.

DESCRIPTION OF EMBODIMENTS

Figure 1:
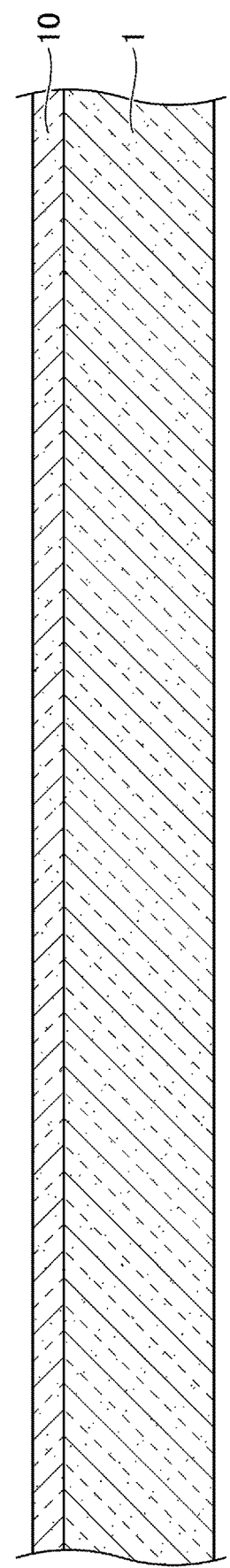
FIG. 1 is a sectional view (part 1) illustrating a method of manufacturing a semiconductor device according to an embodiment.

An electrode is formed on a semiconductor layer in addition to an etching stopper. When the etching stopper is formed simultaneously with the electrode by using the same material, the etching stopper is easily corroded in the step of removing a metal mask. Since the etching stopper is connected to a semiconductor element such as a transistor formed in the semiconductor layer, corrosion of the etching stopper may affect the characteristics of the semiconductor element.

To prevent corrosion of the etching stopper, the metal mask may be removed after temporarily stopping etching in the vicinity of the interface between the substrate and the semiconductor layer, and, then, the etching is resumed to extend a through-hole to the etching stopper. However, unless the etching rate of the substrate is controlled to be low, it is difficult to stop the etching in the vicinity of the interface between the substrate and the semiconductor layer, and when the etching rate of the substrate is lowered, the time required for the etching becomes lengthy. Alternatively, to prevent corrosion of the etching stopper, the etching stopper may be formed using a material different from a material of the electrode. However, in this case, a separate process for forming the etching stopper is necessary, and productivity is lowered.

The present disclosure provides a method of manufacturing a semiconductor device capable of preventing corrosion of an etching stopper while securing good productivity.

First, embodiments of the present disclosure will be listed and described.

(1) A method of manufacturing a semiconductor device according to one aspect of the present disclosure includes forming a semiconductor layer on an upper surface of a substrate, forming an etching stopper on an upper surface of the semiconductor layer, forming, on a lower surface of the substrate, a metal mask including a seed film and a plating film and having an opening inside the etching stopper in plan view, forming, through the opening, a through-hole extending from the lower surface of the substrate to the etching stopper in the substrate and the semiconductor layer, and after the forming the through-hole, removing the plating film by an anodic reaction in an electrolyte solution.

Since the plating film is removed by an anodic reaction in an electrolyte solution, corrosion of the etching stopper during removal of the plating film can be prevented.

(2) In (1), the method may include forming a gate electrode simultaneously with the etching stopper. By forming the etching stopper simultaneously with the gate electrode, higher productivity can be obtained as compared with the case where the etching stopper and the gate electrode are formed separately.

(3) In (2), the forming the etching stopper and the gate electrode may include forming a first metal film in Schottky contact with the semiconductor layer. In this case, good gate controllability is easily obtained.

(4) In (3), the first metal film may be a Ni film. Ni is a material having a large work function and easily forming a Schottky barrier.

(5) In (3) or (4), the method may include forming a Pd film on an upper surface of the first metal film, and forming a Au film on an upper surface of the Pd film. In this case, it is easy to form a low-resistance interconnect.

(6) In (1) to (5), the substrate may be a SiC substrate, and the semiconductor layer may be a nitride semiconductor layer. In this case, it is easy to configure a high electron mobility transistor having a high breakdown voltage and capable of high-speed operation.

(7) In (1) to (6), the method may include, after the removing the plating film, removing the seed film. The seed film can be removed by, for example, dry etching, and corrosion of the etching stopper can be prevented when the seed film is removed.

(8) In (7), the method may include, after the removing the seed film, forming a conductive film on a lower surface of the etching stopper, an inner wall surface of the through-hole, and the lower surface of the substrate. In this case, the conductive film can be used as a bottom electrode, and heat can be dissipated through the conductive film.

(9) A method of manufacturing a semiconductor device according to another aspect of the present disclosure includes forming a nitride semiconductor layer on an upper surface of a SiC substrate, simultaneously forming, on an upper surface of the nitride semiconductor layer, an etching stopper and a gate electrode that include a Ni film in Schottky contact with the nitride semiconductor layer, forming, on a lower surface of the SiC substrate, a metal mask including a seed film and a plating film and having an opening inside the etching stopper in plan view, forming, through the opening, a through-hole extending from the lower surface of the SiC substrate to the etching stopper in the SiC substrate and the nitride semiconductor layer, after the forming the through-hole, removing the plating film by an anodic reaction in an electrolyte solution, after the removing the plating film, removing the seed film, and after the removing the seed film, forming a conductive film on a lower surface of the etching stopper, an inner wall surface of the through-hole, and the lower surface of the SiC substrate.

Since the plating film is removed by an anodic reaction in an electrolyte solution, corrosion of the etching stopper during removal of the plating film can be prevented. In addition, a high electron mobility transistor having a high breakdown voltage and capable of high-speed operation can be easily formed.

Details of Embodiments of Present Disclosure

Hereinafter, embodiments of the present disclosure will be described in detail, but the present disclosure is not limited thereto. It should be noted that in the specification and the drawings of the present application, the same reference numerals may be assigned to components having substantially the same function/configuration so that repetitive descriptions may be omitted.

Embodiments of the present disclosure relate to a method of manufacturing a semiconductor device including a GaN (gallium nitride) based high electron mobility transistor (HEMT). FIGS. 1 to 16 are sectional views illustrating a method of manufacturing a semiconductor device 100 according to an embodiment.

In the embodiment of the present disclosure, first, as shown in FIG. 1, a nitride semiconductor layer 10 containing Ga (gallium) is formed on an upper surface of a substrate 1 by, for example, a metal organic chemical vapor deposition (MOCVD) method. Nitride semiconductor layer 10 includes, for example, a channel layer and a barrier layer. Substrate 1 is, for example, a substrate for growing a GaN-based semiconductor, and is, for example, a semi-insulating SiC (silicon carbide) substrate. For example, the channel layer is a GaN layer, and the barrier layer is an AlGaN (aluminum gallium nitride) layer. Nitride semiconductor layer 10 is an example of a semiconductor layer. For example, the thickness of substrate 1 is about 100 μm, and the thickness of nitride semiconductor layer 10 is about 0.4 μm.

Figure 2:
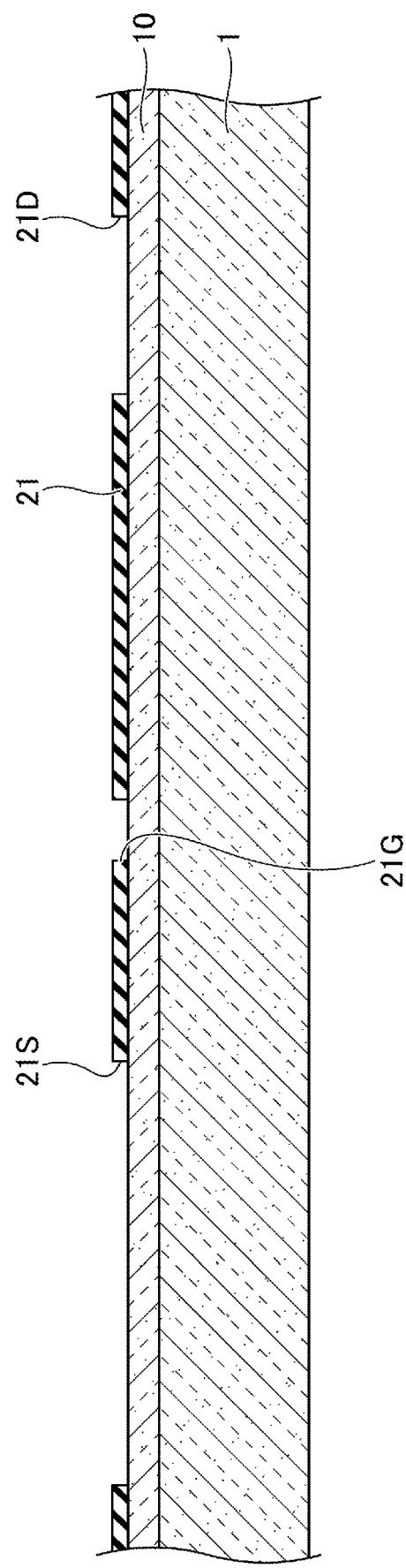
FIG. 2 is a sectional view (part 2) illustrating a method of manufacturing a semiconductor device according to an embodiment.

Next, as shown in FIG. 2, a first insulating film 21 having an opening 21S for source, an opening 21D for drain, and an opening 21G for gate is formed on an upper surface of nitride semiconductor layer 10. First insulating film 21 is, for example, a silicon nitride (SiN) film.

Figure 3:
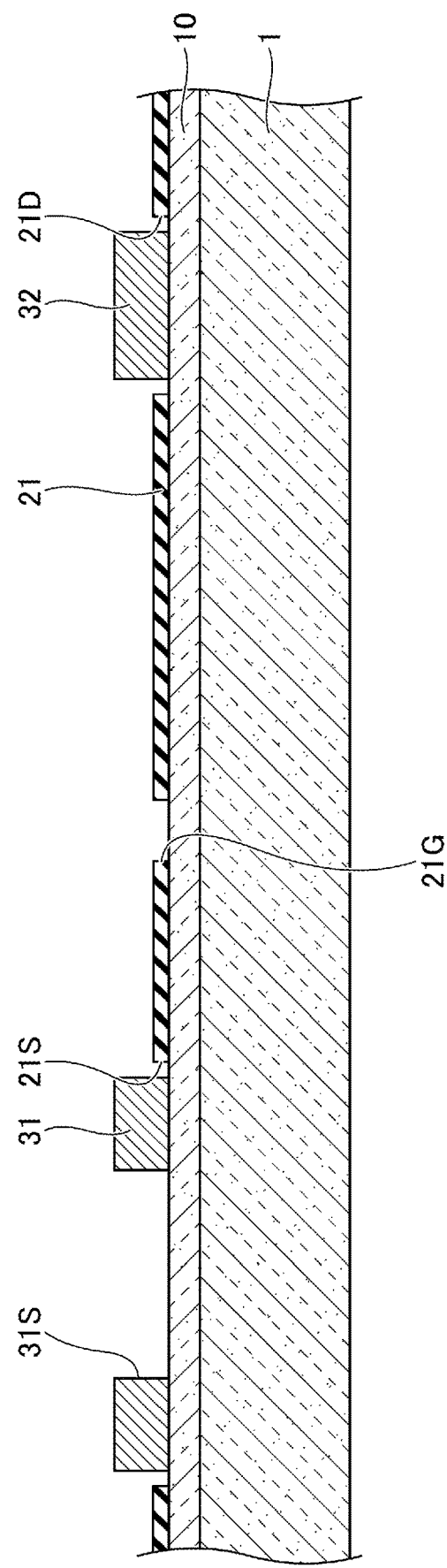
FIG. 3 is a sectional view (part 3) illustrating a method of manufacturing a semiconductor device according to an embodiment.

Next, as shown in FIG. 3, a source electrode 31 is formed inside opening 21S, and a drain electrode 32 is formed inside opening 21D. In the formation of source electrode 31 and drain electrode 32, first, a plurality of metal layers constituting source electrode 31 and drain electrode 32 are deposited, and, for example, a Ta (tantalum) layer is deposited and then an Al (aluminum) layer is deposited to form a laminated structure. Thereafter, the laminated structure is subjected to heat treatment to be alloyed. Source electrode 31 is formed to have an opening 31S through which nitride semiconductor layer 10 is exposed.

Figure 4:
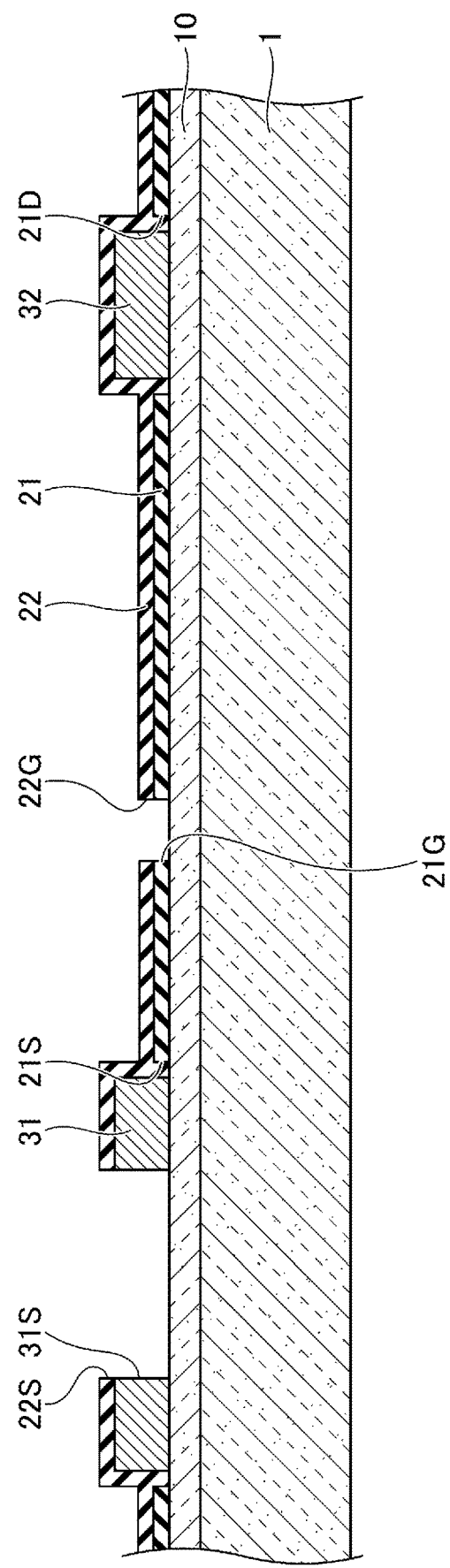
FIG. 4 is a sectional view (part 4) illustrating a method of manufacturing a semiconductor device according to an embodiment.

Next, as shown in FIG. 4, a second insulating film 22 having an opening 22S for source and an opening 22G for gate is formed on an upper surface of first insulating film 21 and nitride semiconductor layer 10 to cover source electrode 31 and drain electrode 32. Second insulating film 22 is, for example, a SiN film.

Figure 5:
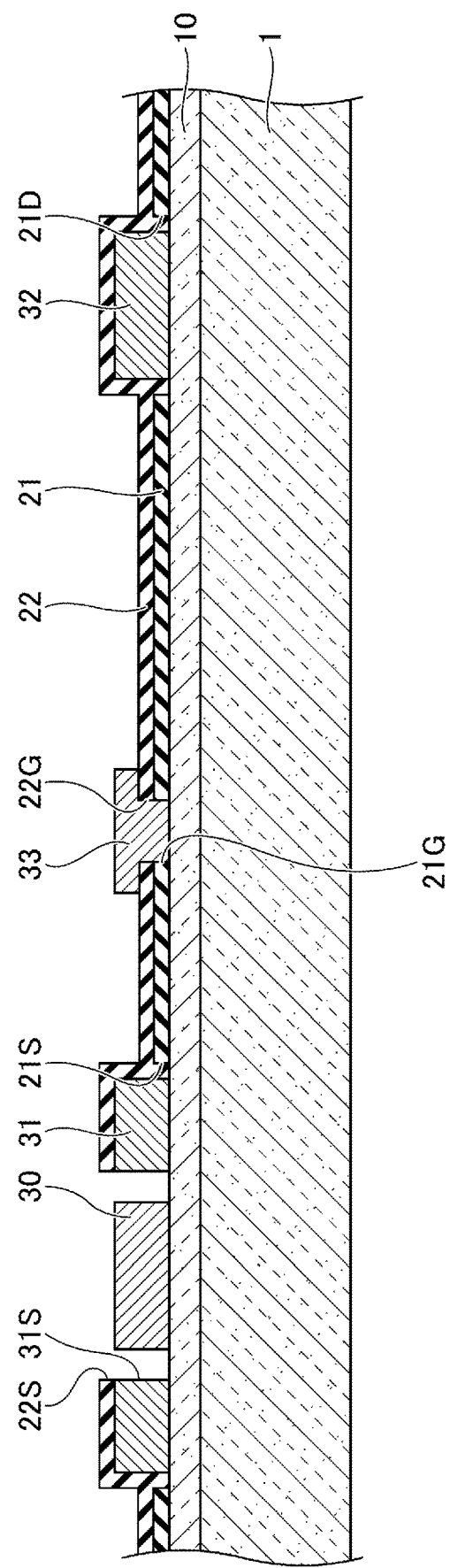
FIG. 5 is a sectional view (part 5) illustrating a method of manufacturing a semiconductor device according to an embodiment.
Figure 6:
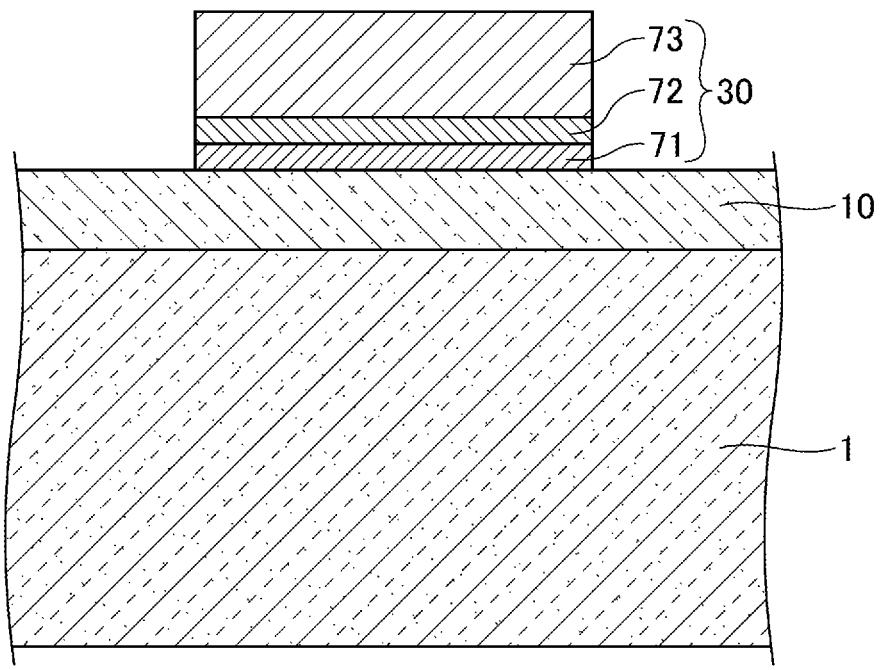
FIG. 6 is a sectional view (part 6) illustrating a method of manufacturing a semiconductor device according to an embodiment.

Next, as shown in FIG. 5, a gate electrode 33 in Schottky contact with nitride semiconductor layer 10 through opening 22G and opening 21G is formed, and an etching stopper 30 is formed on the upper surface of nitride semiconductor layer 10 inside opening 31S. As shown in FIG. 6, gate electrode 33 and etching stopper 30 are formed by forming a Ni (nickel) film 71 on the upper surface of nitride semiconductor layer 10, forming a Pd (palladium) film 72 on an upper surface of Ni film 71, and forming a Au (gold) film 73 on an upper surface of Pd film 72. That is, etching stopper 30 and gate electrode 33 are simultaneously formed using the same material. Ni film 71 is preferable for forming a good Schottky barrier in gate electrode 33 of the GaN-based HEMT. Au film 73 is preferable for reducing electric resistance. Pd film 72 is preferable for suppressing mutual diffusion between Ni film 71 and Au film 73. For example, the thickness of Ni film 71 is about 60 nm, the thickness of Pd film 72 is about 40 nm, and the thickness of Au film 73 is about 350 nm.

Figure 7:
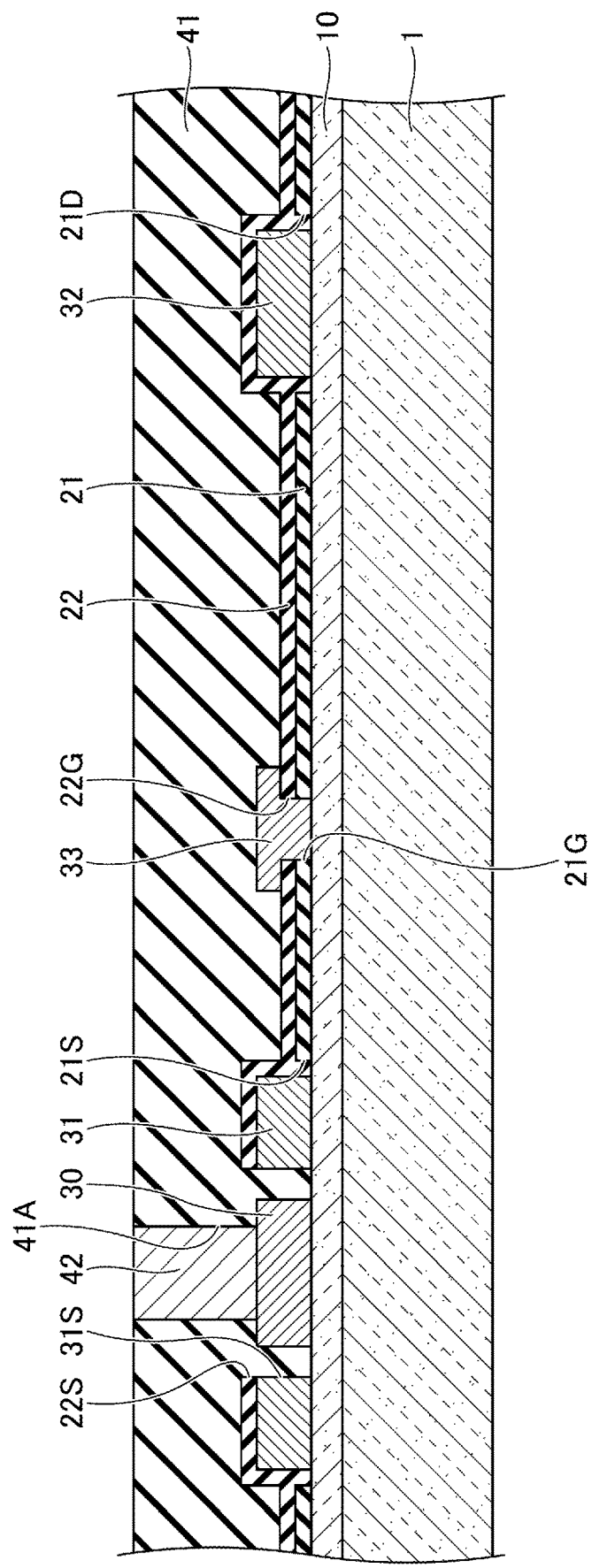
FIG. 7 is a sectional view (part 7) illustrating a method of manufacturing a semiconductor device according to an embodiment.

Next, as shown in FIG. 7, a third insulating film 41 covering second insulating film 22, etching stopper 30, and nitride semiconductor layer 10 is formed, an opening 41A reaching etching stopper 30 is formed in third insulating film 41, and an interconnect 42 contacting etching stopper 30 is formed in opening 41A. Interconnect 42 is electrically connected to, for example, source electrode 31. Simultaneously with the formation of interconnect 42, an interconnect (not shown) electrically connected to drain electrode 32 and an interconnect (not shown) electrically connected to gate electrode 33 may be formed.

Figure 8:
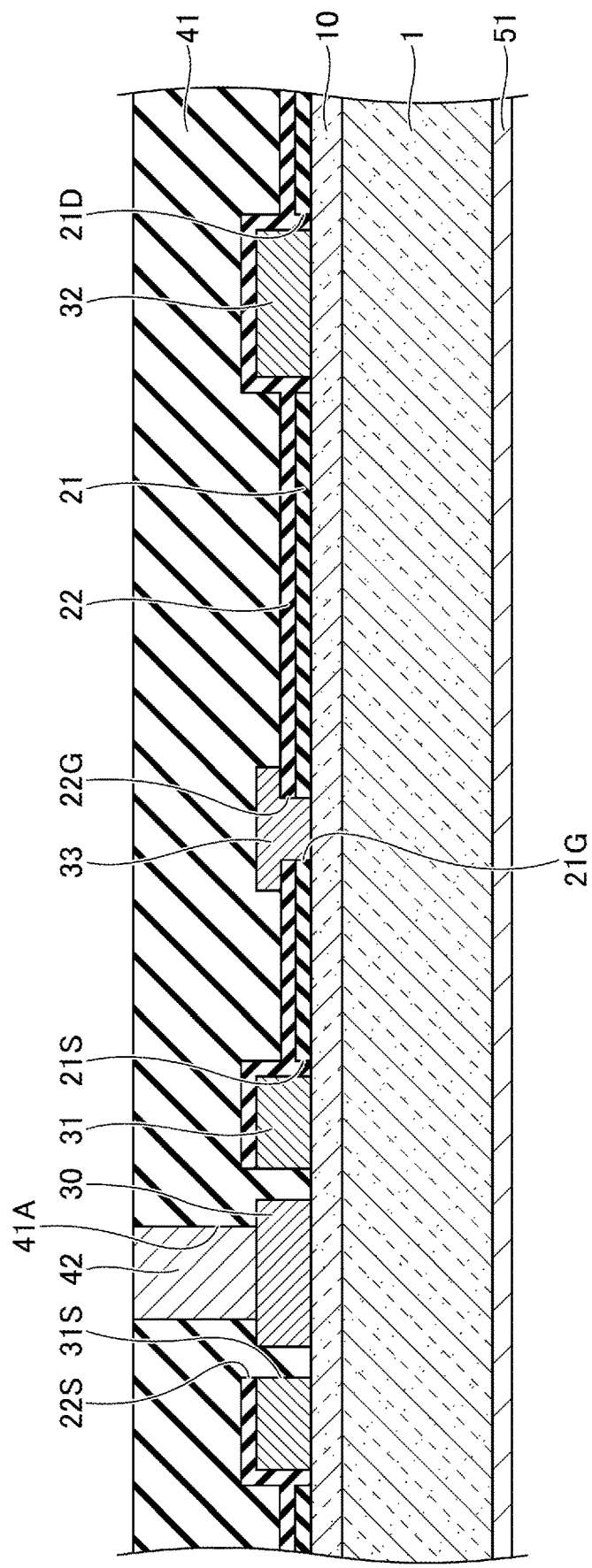
FIG. 8 is a sectional view (part 8) illustrating a method of manufacturing a semiconductor device according to an embodiment.

Next, as shown in FIG. 8, a seed film 51 is formed on a lower surface of substrate 1. Seed film 51 is removed later by dry etching. For this reason, the material of seed film 51 is preferably a material in which the boiling point of a substance generated by reacting with the etching gas is low. Examples of the material of seed film 51 include Ti (titanium), Nb (niobium), Ta, and W (tungsten).

Figure 9:
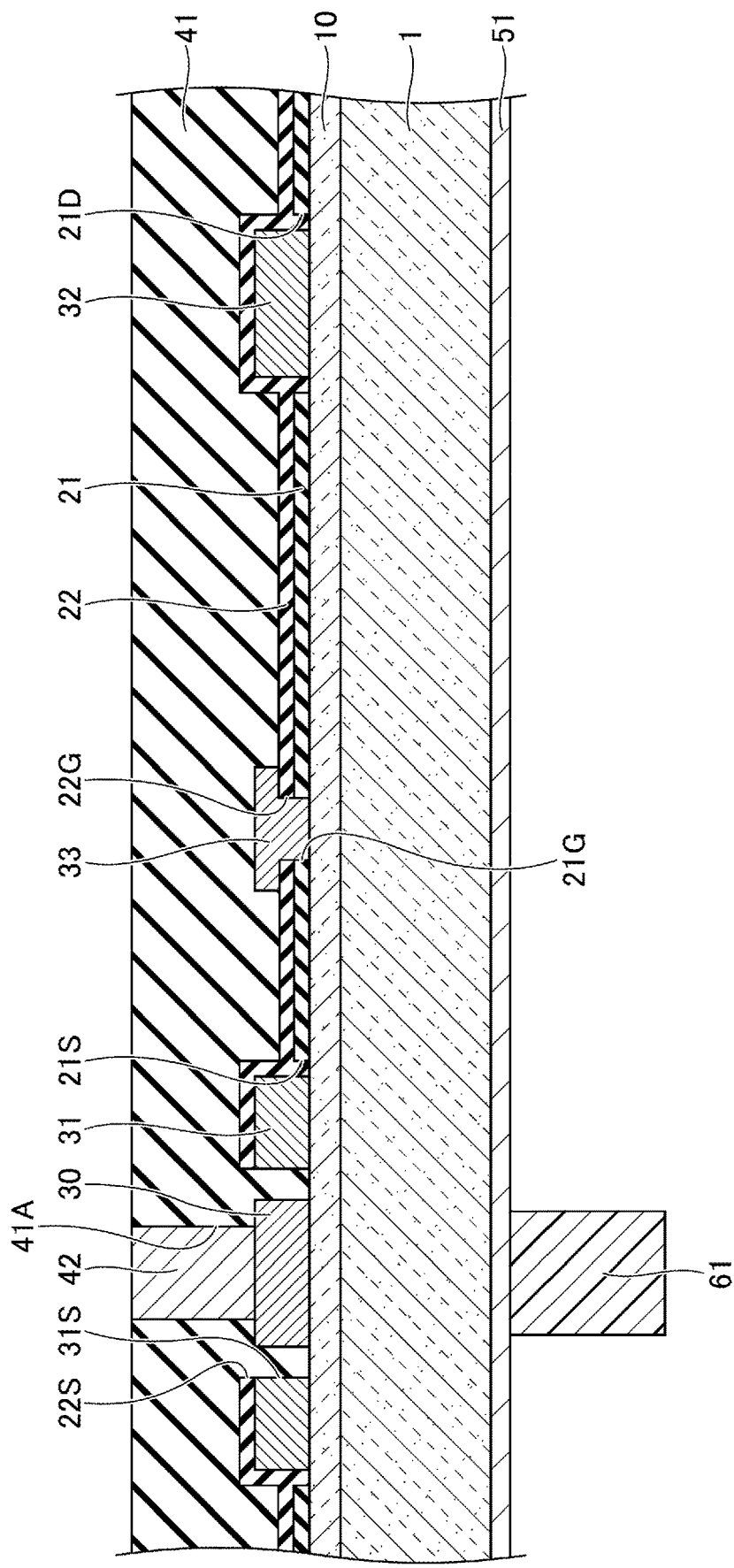
FIG. 9 is a sectional view (part 9) illustrating a method of manufacturing a semiconductor device according to an embodiment.

Next, as shown in FIG. 9, a mask 61 covering a region where a through-hole is to be formed is formed on a lower surface of seed film 51. Mask 61 is, for example, a photoresist mask.

Figure 10:
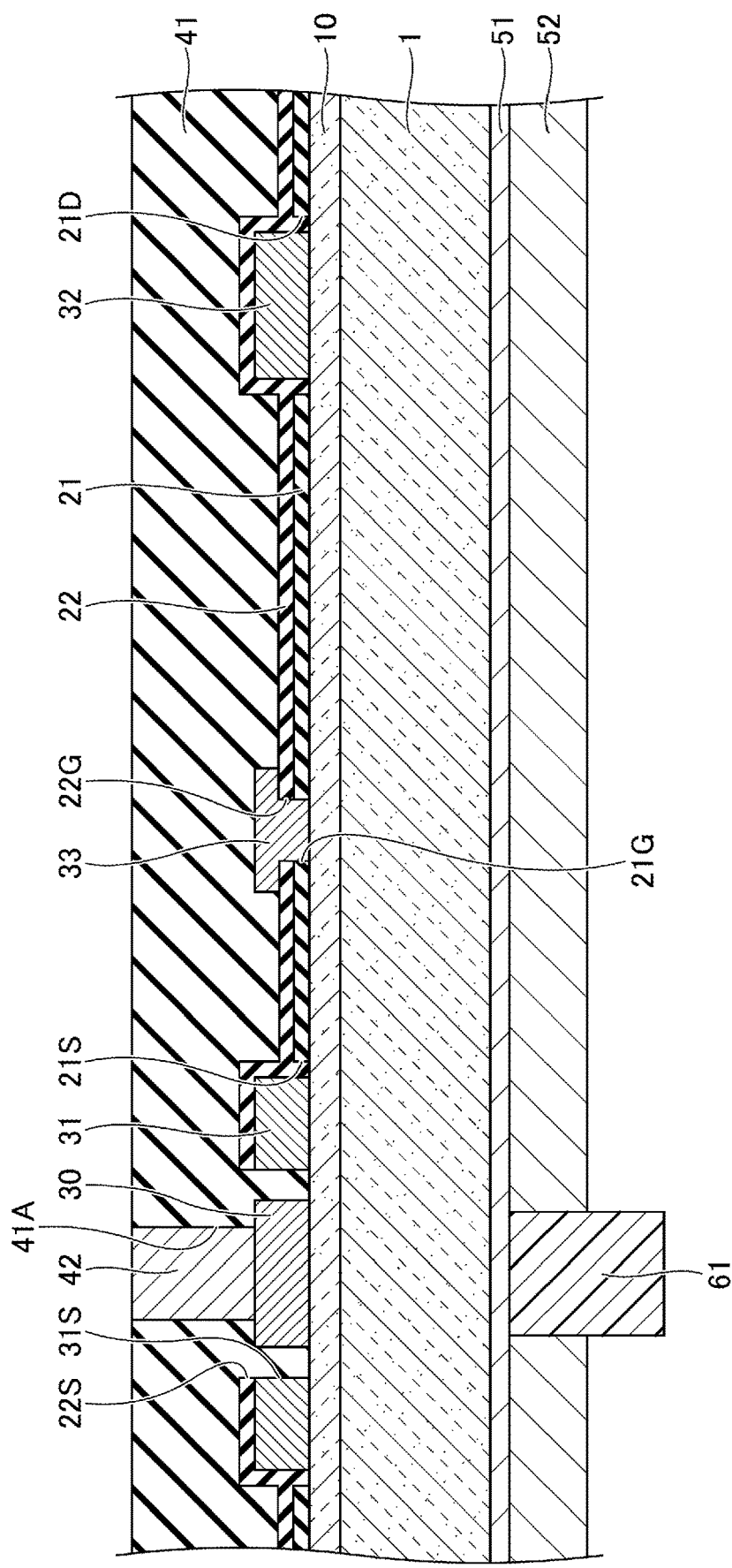
FIG. 10 is a sectional view (part 10) illustrating a method of manufacturing a semiconductor device according to an embodiment.

Next, as shown in FIG. 10, a plating film 52 is formed on a portion of the lower surface of seed film 51 exposed from mask 61. Examples of the material of plating film 52 include Ni, a Ni alloy, Zn (zinc), a Zn alloy, Cu (copper), a Cu alloy, Pt (platinum), and a Pt alloy.

Figure 11:
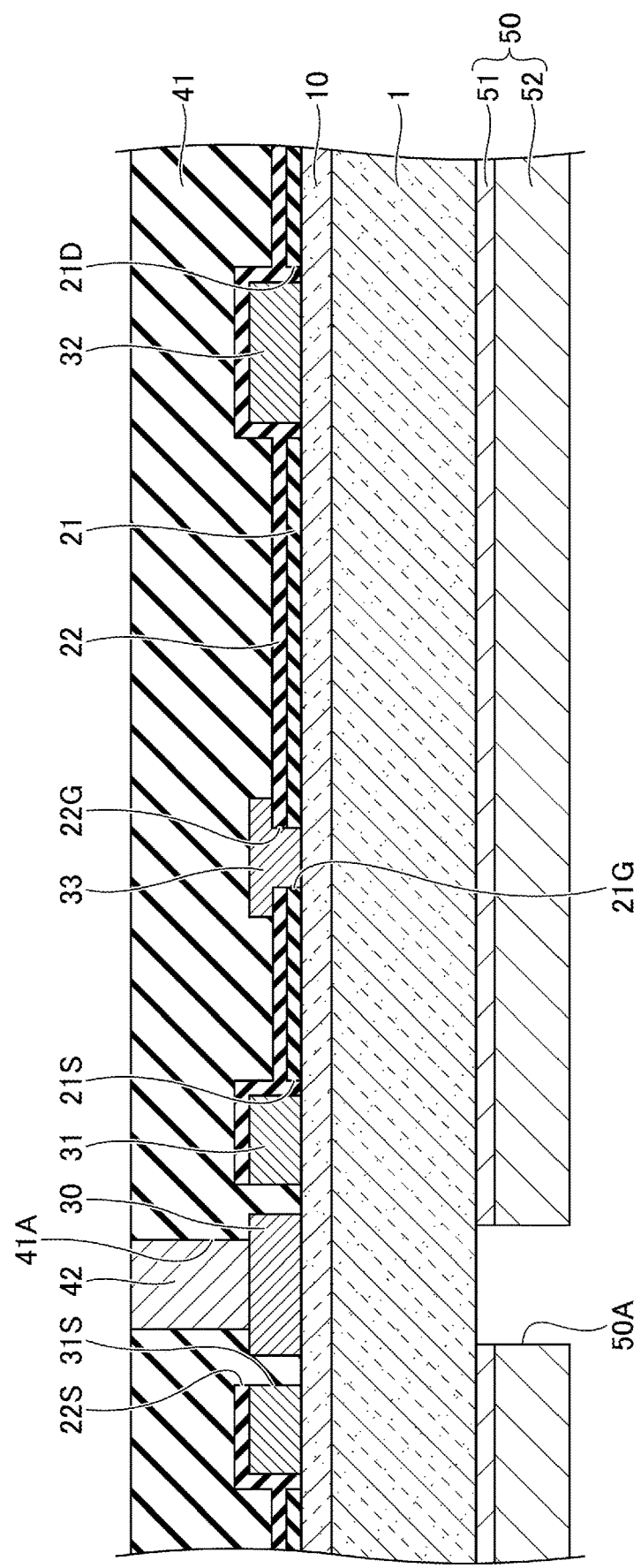
FIG. 11 is a sectional view (part 11) illustrating a method of manufacturing a semiconductor device according to an embodiment.

Next, as shown in FIG. 11, mask 61 is removed. Further, a portion of seed film 51 exposed from plating film 52 is removed. As a result, a metal mask 50 including seed film 51 and plating film 52 and having an opening 50A in a region where a through-hole is to be formed is formed on the lower surface of substrate 1.

Figure 12:
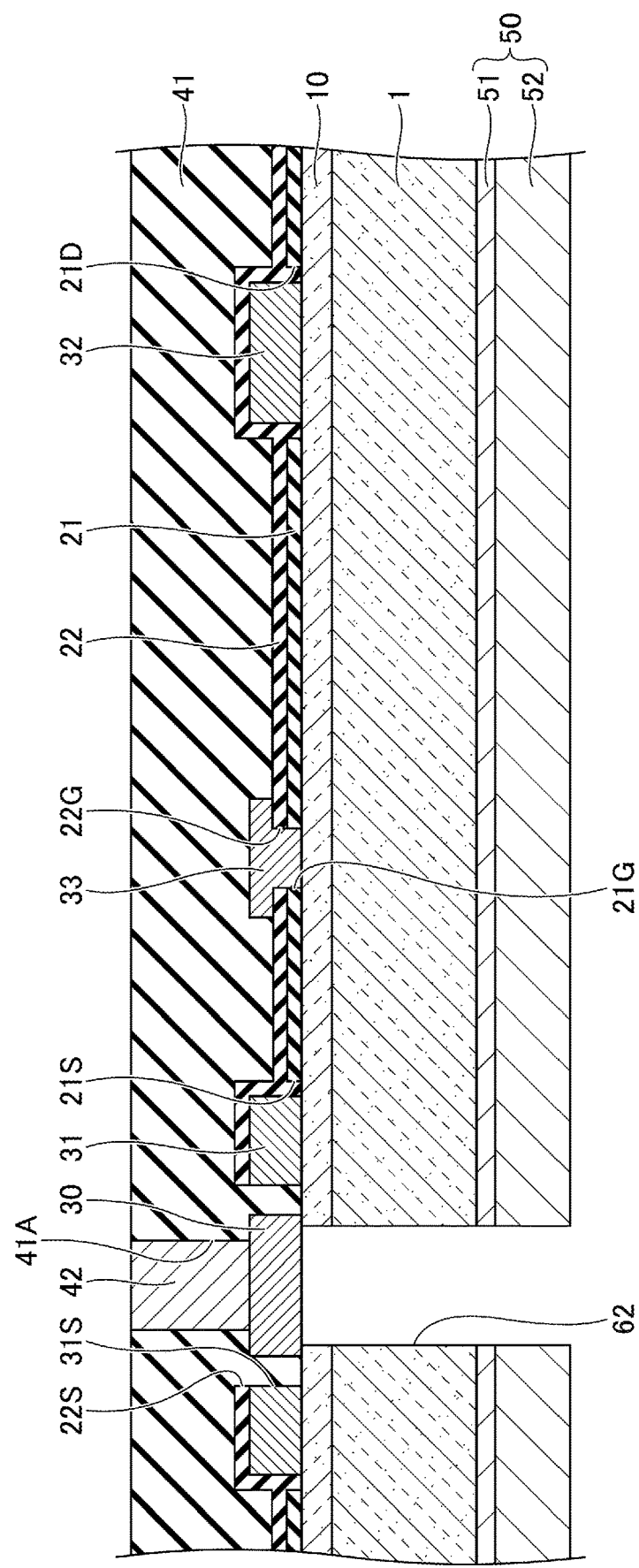
FIG. 12 is a sectional view (part 12) illustrating a method of manufacturing a semiconductor device according to an embodiment.
Figure 13:
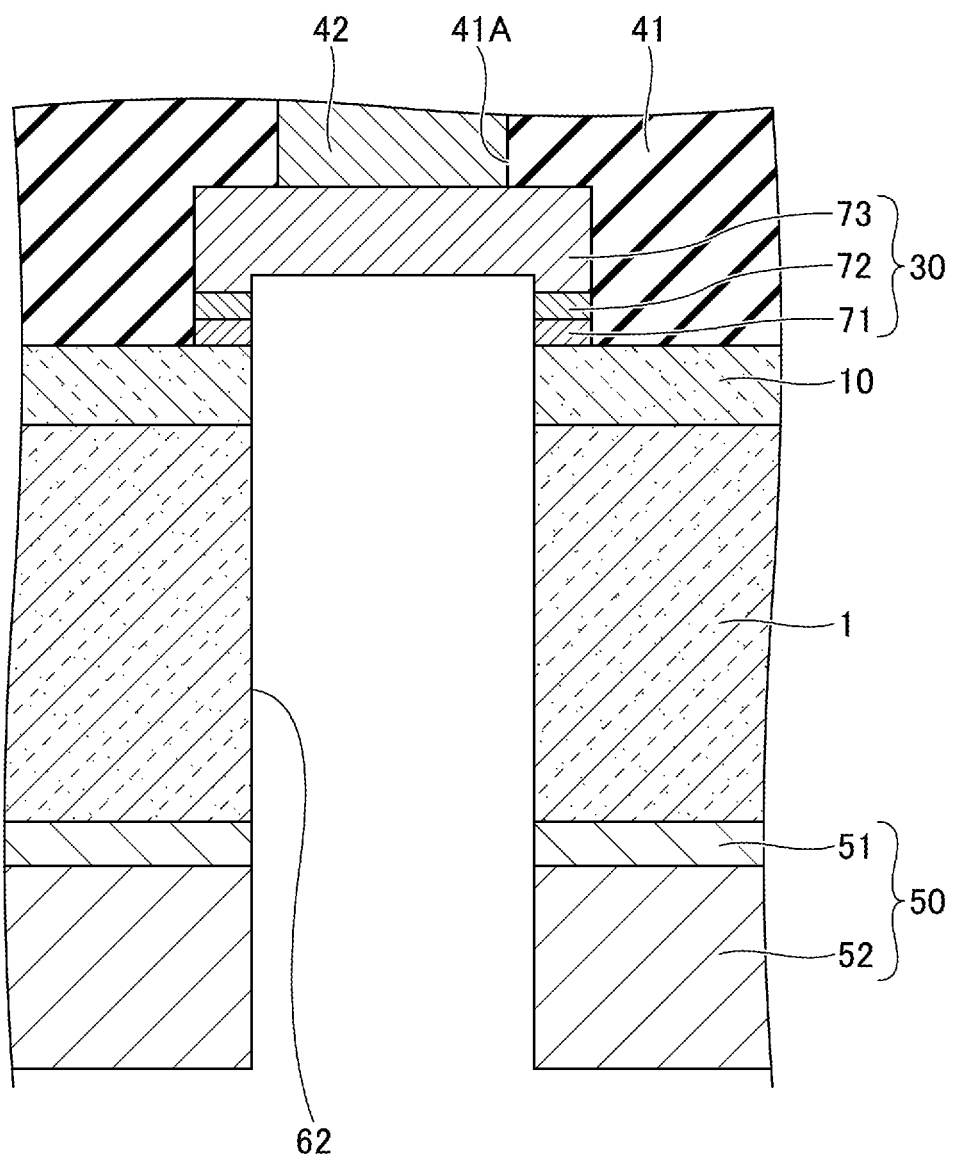
FIG. 13 is a sectional view (part 13) illustrating a method of manufacturing a semiconductor device according to an embodiment.

Next, as shown in FIG. 12, a through-hole 62 reaching etching stopper 30 is formed in substrate 1 and nitride semiconductor layer 10 by performing dry etching of substrate 1 and nitride semiconductor layer 10 using metal mask 50. In this dry etching, for example, a mixture gas of $SF_6$ and $O_2$ is used, the flow rate of $SF_6$ is 65 sccm, the flow rate of $O_2$ is 130 sccm, the internal pressure of the processing chamber is 0.5 Pa, and the bias power is 400 W. The dry etching is stopped, for example, in a time-controlled manner. For example, as shown in FIG. 13, through-hole 62 may reach the middle of Au film 73 in the thickness direction. Through-hole 62 may reach the middle of Ni film 71 or Pd film 72 in the thickness direction.

Figure 14:
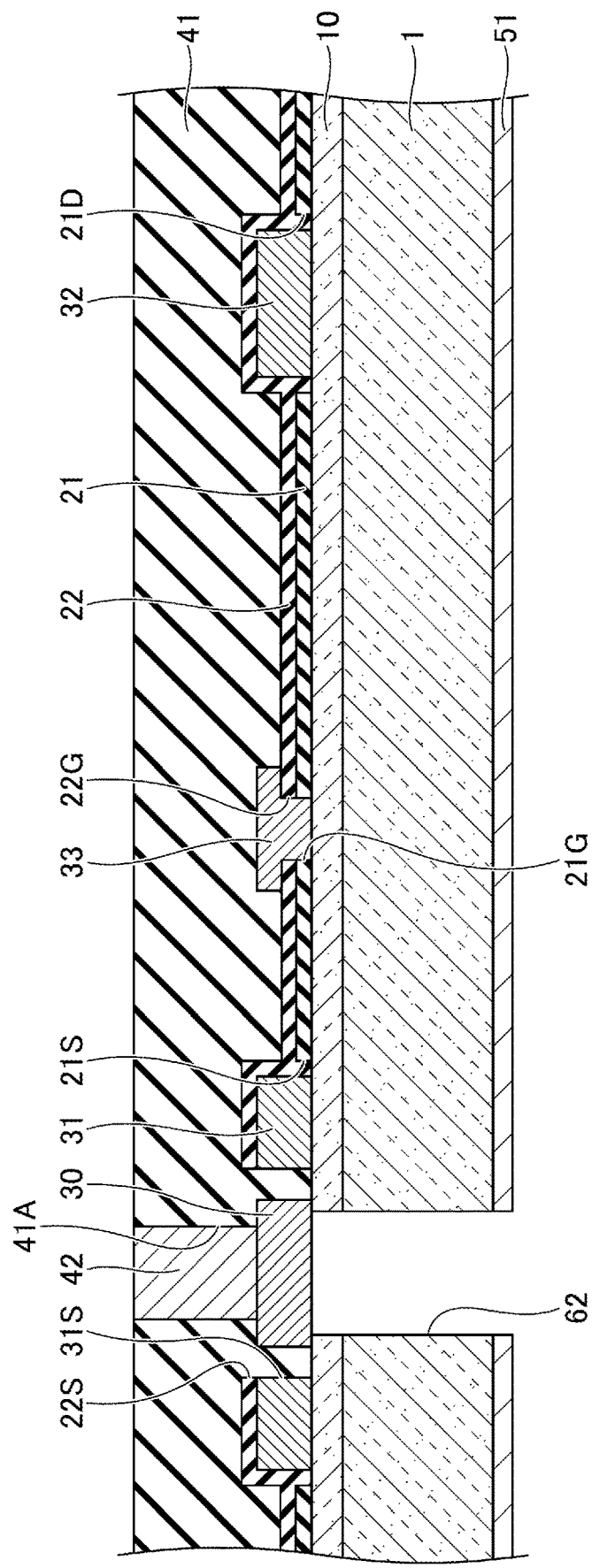
FIG. 14 is a sectional view (part 14) illustrating a method of manufacturing a semiconductor device according to an embodiment.
Figure 17:
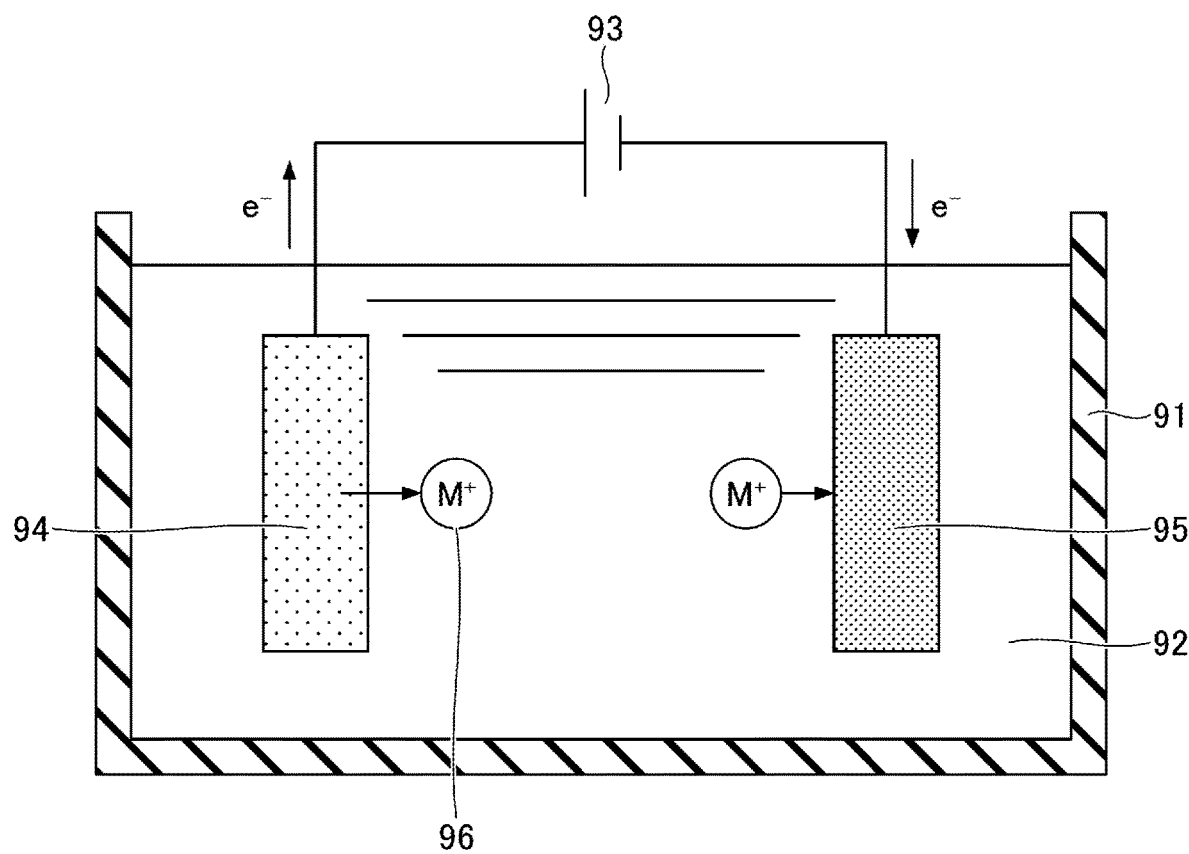
FIG. 17 is a diagram illustrating an example of a configuration for generating an anodic reaction.

Next, as shown in FIG. 14, plating film 52 is removed. Plating film 52 is removed by an anodic reaction in an electrolyte solution. Here, a method of removing plating film 52 will be described. FIG. 17 is a diagram illustrating an example of an electrochemical reaction apparatus for generating an anodic reaction.

In an example of an electrochemical reaction apparatus 200 shown in FIG. 17, an electrolyte solution 92 is provided in a treatment tank 91, and an anode 94 and a cathode 95 are inserted into electrolyte solution 92. Anode 94 is made of metal. Anode 94 is connected to a positive terminal of a direct-current power supply 93, and cathode 95 is connected to a negative terminal of direct-current power supply 93. In this example, a metal cation 96 is expelled from metal anode 94, and metal cation 96 in electrolyte solution 92 is deposited as metal on the surface of cathode 95. Therefore, by using plating film 52 for anode 94, plating film 52 can be dissolved and removed. Such an anodic reaction is sometimes referred to as reverse plating. The components of electrolyte solution 92 are determined according to the material of plating film 52.

Figure 15:
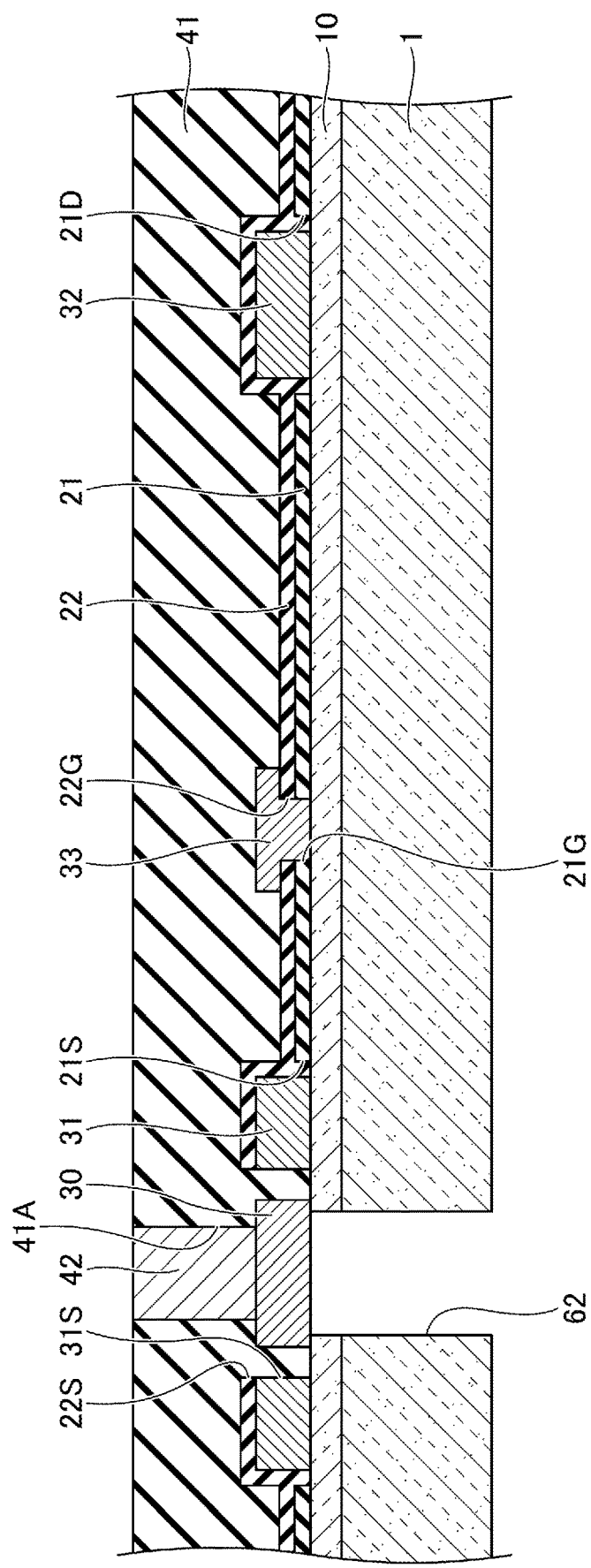
FIG. 15 is a sectional view (part 15) illustrating a method of manufacturing a semiconductor device according to an embodiment.

Next, as shown in FIG. 15, seed film 51 is removed. Seed film 51 can be removed by, for example, dry etching using $CF_4$. Alternatively, an anodic reaction for removing plating film 52 in an electrolyte solution may be utilized to also remove seed film 51.

Figure 16:
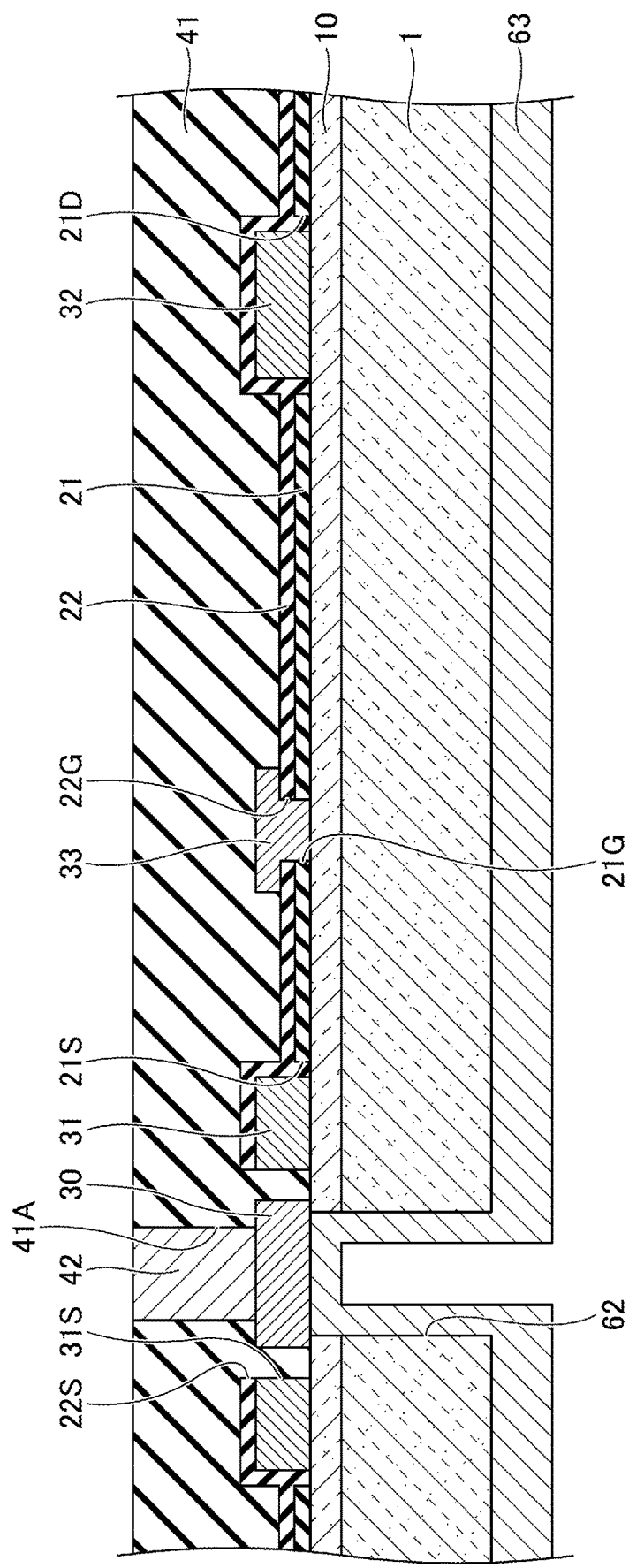
FIG. 16 is a sectional view (part 16) illustrating a method of manufacturing a semiconductor device according to an embodiment.

Next, as shown in FIG. 16, a conductive film 63 is formed on a lower surface of etching stopper 30, an inner wall surface of through-hole 62, and the lower surface of substrate 1. Conductive film 63 is used as, for example, a bottom electrode of semiconductor device 100. Conductive film 63 is provided with, for example, an interconnect layer (not shown), and is electrically connected to source electrode 31 via metal etching stopper 30. By grounding conductive film 63, a ground potential is applied to source electrode 31. Conductive film 63 includes, for example, Au film. In forming conductive film 63, formation of a seed film and formation of a plating film may be performed.

In this manner, semiconductor device 100 can be manufactured.

In this method of manufacturing, since plating film 52 is removed by an anodic reaction in an electrolyte solution, it is possible to prevent etching stopper 30 from being corroded when plating film 52 is removed.

If plating film 52 was removed using an acidic solution after through-hole 62 was formed, Ni film 71 exposed in through-hole 62 would be corroded.

It could also be conceivable to temporarily stop the etching in the vicinity of the interface between substrate 1 and nitride semiconductor layer 10, to remove plating film 52, and then to resume the etching that causes through-hole 62 to reach etching stopper 30. In this case, unless the etching rate of substrate 1 was controlled to be low, it would be difficult to stop the etching near the interface between substrate 1 and nitride semiconductor layer 10. If the etching rate of substrate 1 was lowered, the time required for the etching would be increased.

Etching stopper 30 could be formed of a material different from a material of gate electrode 33 to prevent corrosion of etching stopper 30. In this case, a process of forming etching stopper 30 would be required in addition to the process of forming gate electrode 33, and thus productivity would be lowered.

Since substrate 1 is a SiC substrate and nitride semiconductor layer 10 is formed, it is easy to configure a HEMT capable of high breakdown voltage and high-speed operation. In the embodiment of the present disclosure, even if substrate 1 is the SiC substrate, the etching for forming through-hole 62 can be easily stopped at etching stopper 30 by time control, so that through-hole 62 can be formed at high speed.

Further, since seed film 51 can be removed by, for example, dry etching, corrosion of etching stopper 30 can be prevented when seed film 51 is removed. Further, conductive film 63 can be used as the bottom electrode. In addition, heat generated in the HEMT is easily transferred to the lower surface side of substrate 1 through conductive film 63. By bonding conductive film 63 to a heat spreader or the like, heat dissipation can be improved.

Although the embodiments have been described in detail above, the present invention is not limited to the specific embodiments, and various modifications and changes can be made within the scope described in the claims.

What is claimed is:

1. A method of manufacturing a semiconductor device, the method comprising:
   forming a semiconductor layer on an upper surface of a substrate;
   forming an etching stopper on an upper surface of the semiconductor layer;
   forming, on a lower surface of the substrate, a metal mask including a seed film and a plating film and having an opening inside the etching stopper in plan view;
   forming, through the opening, a through-hole extending from the lower surface of the substrate to the etching stopper in the substrate and the semiconductor layer; and
   after the forming the through-hole, removing the plating film by an anodic reaction in an electrolyte solution.

2. The method of manufacturing a semiconductor device according to claim 1, the method comprising forming a gate electrode simultaneously with the etching stopper.

3. The method of manufacturing a semiconductor device according to claim 2, wherein the forming the etching stopper and the gate electrode includes forming a first metal film in Schottky contact with the semiconductor layer.

4. The method of manufacturing a semiconductor device according to claim 3, wherein the first metal film is a Ni film.

5. The method of manufacturing a semiconductor device according to claim 3, the method comprising:
   forming a Pd film on an upper surface of the first metal film; and
   forming a Au film on an upper surface of the Pd film.

6. The method of manufacturing a semiconductor device according to claim 1,
   wherein the substrate is a SiC substrate, and
   the semiconductor layer is a nitride semiconductor layer.

7. The method of manufacturing a semiconductor device according to claim 1, the method comprising, after the removing the plating film, removing the seed film.

8. The method of manufacturing a semiconductor device according to claim 7, the method comprising, after the removing the seed film, forming a conductive film on a lower surface of the etching stopper, an inner wall surface of the through-hole, and the lower surface of the substrate.

9. A method of manufacturing a semiconductor device, the method comprising:
   forming a nitride semiconductor layer on an upper surface of a SiC substrate;
   simultaneously forming, on an upper surface of the nitride semiconductor layer, an etching stopper and a gate electrode that include a Ni film in Schottky contact with the nitride semiconductor layer;
   forming, on a lower surface of the SiC substrate, a metal mask including a seed film and a plating film and having an opening inside the etching stopper in plan view;
   forming, through the opening, a through-hole extending from the lower surface of the SiC substrate to the etching stopper in the SiC substrate and the nitride semiconductor layer;
   after the forming the through-hole, removing the plating film by an anodic reaction in an electrolyte solution;
   after the removing the plating film, removing the seed film; and
   after the removing the seed film, forming a conductive film on a lower surface of the etching stopper, an inner wall surface of the through-hole, and the lower surface of the SiC substrate.

* * * * *